United States Patent
Kimmlingen et al.

(12) 
(10) Patent No.: US 6,717,409 B2
(45) Date of Patent: Apr. 6, 2004

(54) METHOD FOR CALCULATING CONDUCTOR PATHS IN A SWITCHED GRADIENT COIL SYSTEM, AND MAGNETIC RESONANCE TOMOGRAPHY APPARATUS EMPLOYING SUCH A SWITCHED GRADIENT COIL SYSTEM

(75) Inventors: Ralph Kimmlingen, Nuremberg (DE); Johann Schuster, Oberasbach (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/277,070

(22) Filed: Oct. 21, 2002

(65) Prior Publication Data

US 2003/0094949 A1 May 22, 2003

(30) Foreign Application Priority Data

Oct. 19, 2001 (DE) .......................................... 101 51 667

(51) Int. Cl.⁷ .................................................. G01V 3/00
(52) U.S. Cl. ...................................... 324/318; 324/320
(58) Field of Search ............................... 324/318, 320, 324/309, 312, 306, 322; 600/419

(56) References Cited

U.S. PATENT DOCUMENTS 6,025,715 A * 2/2000 King et al. ................. 324/309

6,236,208 B1 * 5/2001 Ham et al. .................. 324/318
6,418,336 B1   7/2002 Kimmlingen et al.

FOREIGN PATENT DOCUMENTS

DE  PS 199 17 058  10/2000
EP  0 488 445      6/1992

OTHER PUBLICATIONS

Harvey et al, Modular Gradient Coil; Magnetic resonance in Medicine 42: 561–570 (1999).*

Kimmlingen er al, Gradinet System with Continuously Field Characteristics; Proc. Natl. Soc. Mag. Reson. Med. p. 332, (2000).*

* cited by examiner

*Primary Examiner*—Brij B. Shrivastav
(74) *Attorney, Agent, or Firm*—Schiff Hardin LLP

(57) ABSTRACT

In a method for calculating conductor tracks of a gradient coil in a gradient coils for a magnetic resonance tomography apparatus and a magnetic resonance tomography apparatus employing such a gradient coil system, conductor tracks are calculated for a primary coil with multiple conductor bundles, and for a second coil which shields the primary coil, as well as for at least one booster coil that is interconnected with the conductor bundles of the primary coil, and with the secondary coil, so that a number of different homogeneity volumes can be produced at the center of the gradient coil system.

4 Claims, 6 Drawing Sheets

FIG. 6a
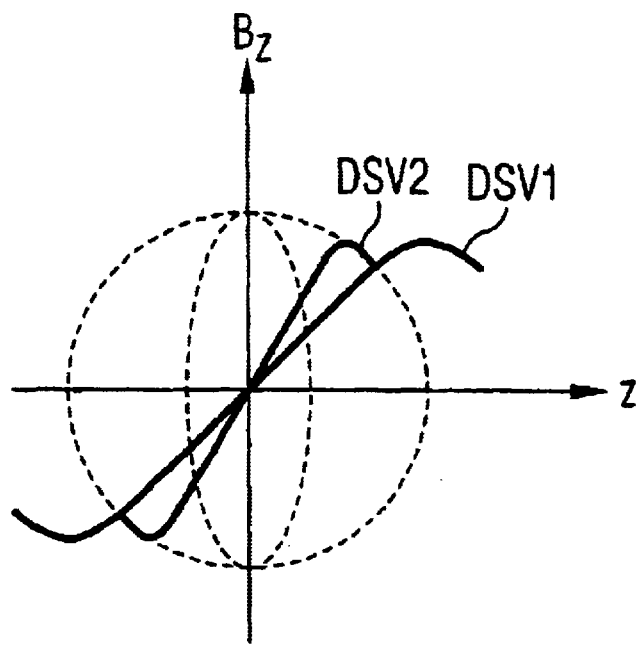
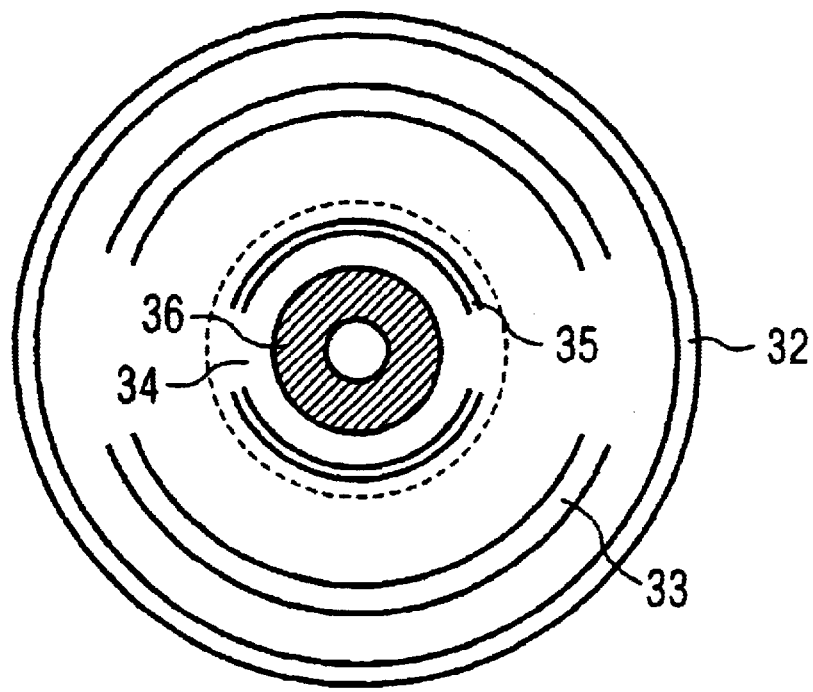
FIG. 6b

METHOD FOR CALCULATING CONDUCTOR PATHS IN A SWITCHED GRADIENT COIL SYSTEM, AND MAGNETIC RESONANCE TOMOGRAPHY APPARATUS EMPLOYING SUCH A SWITCHED GRADIENT COIL SYSTEM

BACKGROUND OF THE INVENTION

1. Field of the Invention

The present invention relates in general to a gradient system for use in magnetic resonance tomography (MRT) for examining patients. The present invention relates, in particular, to a switchable gradient system and to a method for calculating such a system, in the case of which so-called booster coils are used.

2. Description of the Prior Art

MRT is based on the physical phenomenon of nuclear spin resonance and has been used successfully as an imaging method for over 15 years in medicine and in biophysics. In this method of examination, the object is exposed to a strong, constant magnetic field. This aligns the nuclear spins of the atoms in the object, which were previously oriented randomly. Radio-frequency energy can excite these "ordered" nuclear spins to a specific oscillation (resonant frequency). In MRT, this oscillation generates the actual measurement signal (RF response signal), which is picked up by suitable receiving coils.

Having exact information relating to the respective origination location of the RF response signal (location information or location coding) is a precondition for the image reconstruction. This location information is obtained by means of additional magnetic fields (magnetic gradient fields) relative to the static magnetic field along the three spatial directions. These gradient fields are small by comparison with the main field and are generated by additional resistance coils in the patient opening of the magnet. Due to the gradient fields, the overall magnetic field differs in each volumetric element and therefore so is the resonant frequency. If a defined resonant frequency is irradiated, it is therefore possible to excite only the atomic nuclei that are situated at a location at which the magnetic field fulfills the resonance condition. A suitable change in the gradient fields allows the location of such a volumetric element where the resonance condition is fulfilled to be displaced in a defined fashion, and thus for the desired region to be scanned. The gradient fields are therefore switched repeatedly in an MR sequence for excitation (coding) and reading out (detection) of the nuclear resonance signals.

This allows a free choice of the layer to be imaged, as a result of which it is possible to obtain tomographic images of the human body in all directions.

The basic design of an MRT apparatus is illustrated in FIG. 4. A basic field magnet 23 (for example an axial superconducting air-coil magnet with active stray field screening) which generates a homogeneous magnetic basic field in an interior space. The superconducting magnet 23 contains superconducting coils which are located in liquid helium. The basic field magnet 23 is surrounded by a double-shell tank which is made of stainless steel, as a rule. The inner tank, which contains the liquid helium and serves in part as winding body for the magnet coils, is suspended at the outer tank, which is at room temperature, via fiberglass-reinforced plastic rods which are poor conductors of heat. A vacuum prevails between inner and outer tanks.

The cylindrical gradient coil 25 in the inner space of the basic field magnet 23 is inserted concentrically into the interior of a support tube by means of support elements 24. The support tube is delimited externally by an outer shell 26, and internally by an inner shell 27.

The gradient coil 25 has three windings which generate respective gradient fields, each field being proportional to the current in each coil and being orthogonal to one another. As illustrated in FIG. 5, the gradient coil 25 has an x-gradient coil 28, a y-gradient coil 29 and a z-gradient coil 30, which are respectively wound around the coil core 31 and thus generate a gradient field, respectively in the directions of the Cartesian coordinates x, y and z. Each of these coils is fitted with a dedicated power supply unit in order to generate independent current pulses with accurate amplitudes and timing in accordance with the sequence programmed in the pulse sequence controller 20. The required currents are at approximately 250 A. Since the gradient switching times are to be as short as possible, current rise rates and current fall rates (slew rates) on the order of magnitude of 250 kA/s are necessary. A high gradient power is required in order to obtain images with high spatial resolution and a short measuring time. According to the current state of the art, the gradient intensities are 30–60 mT/m for switching times of 100–500 $\mu$s.

However, these high rates of change in the magnetic field in the body of the patient, at times, can cause painful peripheral nerve stimulations. The threshold for peripheral nerve stimulations scales with the magnitude of the homogeneity volume (DSV=Diameter of Spherical Volume, or field mode), which is fixed by the gradient system.

For this reason, and in order to do justice to different applications in MRT—in particular in functional imaging—it is necessary to lend the MRT machine DSV flexibility. The technically possible system power, in conjunction with avoidance of peripheral nerve stimulations, can be fully exploited according to the current state of the art by using a gradient system that has a number of field characteristics (field modes). The field characteristic, or the field mode, describes a generally spherical region in the interior of the homogeneous basic field in which the gradient deviates by less than 5% from the reference value at the coil center. The radius and quality of the corresponding homogeneity region definitively determine the essential system properties of the gradient system such as switching time, maximum gradient intensity and stimulation threshold. According to the current state of the art, they can be changed in discrete steps by using switchable gradient coils.

According to the current state of the art, a switchable gradient system with a number of field characteristics can be implemented in various ways respectively having different advantages and disadvantages:

A) by combining or integrating a number of (completely shielded) coil sections.

B) Modular conductor bundling, by combining suitable conductor bundles within a coil plane for a discrete number of field characteristics.

In order, for example, to generate two different field characteristics, in method A two different (actively shielded) coils are interleaved. Different field modes can be obtained by appropriate electric interconnection of the two coils.

FIG. 6a schematically illustrates the idealized z-direction field pattern of two whole-body gradient fields DSV1, DSV2 with different homogeneity radii. The two fields are generated by a gradient system of a whole-body tomography apparatus with two independent coil sections in the z-direction. FIG. 6b shows a transverse section (x-y plane) through the whole-body tomography apparatus.

The gradient system is shielded from the outside and from the superconducting basic field magnet by a cryoshield 32 (referred to as the tank above). The system uses a large whole-body coil 33, which produces a correspondingly large spherical homogeneity volume (DSV1) 34.

Disadvantages of this large-volume whole-body coil 33 are a high inductance and a high stimulation effect. These two disadvantages can be compensated by the use of a second smaller coil—the so-called insert coil 35. By energizing the insert coil 35, a small, elliptical homogeneity volume (DSV2) 36 inside the large homogeneity volume of the basic field magnet is typically obtained.

As can be seen from FIG. 6b, each of the two coil sections 33, 35 occupies a hollow cylinder of a certain thickness. The radii of the respective hollow cylinders are different as a rule, and the coil sections are therefore located on different winding planes. As already indicated and as can be seen in FIG. 4b—this leads to a reduction in the inside diameter of the gradient tube and to a reduction in the patient space.

Such a design is therefore compatible with the current MRT machine standards only in a restricted fashion. The radius of the insert coil may therefore not be selected to be excessively small.

Method A) therefore has the disadvantage that it can only be used, given the currently customary current strengths (>400A) and load cycles, if the inside diameter of the gradient tube may be reduced—owing to the greater space requirement for additional coil sections and for additional cooling planes. However, since a defined magnet diameter and thus a defined space requirement for the MRT machine components have gained international acceptance, changing specific components would be attended by a substantial extra outlay and costs connected therewith in the case of current MRT systems.

In method B), conductor bundles are combined within a coil plane and interconnected in different ways such that desired field characteristics can be generated.

The difference between the modular conductor bundling and method A) is that the conductor bundling relates to the winding plane of a coil. No independent coils are used, but existing coils are suitably divided.

In this case, the field property of each individual conductor (turn) is firstly considered in computational terms. Jointly usable conductor regions (conductor bundles) can be identified by subsequently comparing different current density distributions that are generated computationally by different combinations of individual conductors. The selection of suitable conductor bundles is performed in each case for a desired characteristic homogeneity volume. Methods for identifying optimum conductor combinations are, for example, Simulated Annealing or Genetic Algorithms.

The principle of conductor bundling in the case of transverse gradient coils (saddle coils) or longitudinal gradient coils (Maxwell coils) is illustrated schematically in FIGS. 7a and 7b, respectively.

In order to calculate the corresponding coil, a known iterative optimization method (target field) is used. In this method, the desired magnetic field pattern (the target field) on a desired DSV geometry (cylinder surface, ellipsoid: 37, 38, 39, etc.) is prescribed in the coil interior, and the current density distribution on the coil surface is derived therefrom. The contour lines of the integral of the calculated current density are used to generate the conductor track layout.

It may be seen from FIG. 7a) that the conductor tracks of a transverse coil octant form semi-ellipses whose number rises in general with a rising field homogeneity requirement (39→38→37) in the axial direction.

In a first step, the conductors are packed in the longitudinal (axial) direction. As can be seen in FIG. 7b, the longitudinal extent of the homogeneity ellipsoid scales directly with the longitudinal extent of the conductor packet (37→40; 38→41; 39→42).

In general, the resulting field characteristics have inadequate rotational field shielding and inadequate linearity. Consequently, the packing is refined in a second step.

In the second step, individual conductors 43 are specifically permutated over winding packets. The quality of this correction is a function of the number of the available conductor loops.

However, with increasing shortening of the homogeneity ellipsoid (39→38→37) there is also a shortening in the coil generating the homogeneity ellipsoid, and thus a decrease in its gradient intensity: the field efficiency is reduced (the value that guarantees a defined field strength given a defined energization of the coil). The field efficiency denotes the gradient intensity that is obtained when a defined current is impressed on a coil (for example 1A→80 μT/Am).

Thus, method B) has the disadvantage that the conductor bundling entails an extremely complex interconnection; and the field efficiency decreases with decreasing imaging volume (field mode with small homogeneity volume).

SUMMARY OF THE INVENTION

It is an object of the present invention to provide a switchable gradient system and a method for constructing such a system, in which the above disadvantages become irrelevant or are eliminated, that is, in which the conductor bundling for the different field modes is simplified to facilitate production and the field efficiency is compensated in the case of small field modes.

This object is achieved in accordance with the invention in a magnetic resonance tomography apparatus having a gradient coil system which includes at least one gradient coil arrangement for generating a gradient field in a spatial direction. This gradient coil arrangement includes at least one gradient coil in the form of a primary coil with different conductor bundles, and a secondary coil for shielding the primary coil, as well as at least one booster coil that can likewise be constructed from different conductor bundles. The primary coil, secondary coil and booster coil are interconnected so that different homogeneity volumes can be produced at the center of the gradient coil system.

In order to produce a desired homogeneity volume with enhanced performance characteristics, according to the invention one or more modules of the primary coil are connected in series to the secondary coil and one or more booster coils.

In accordance with the invention, each booster coil is arranged on a winding plane between the primary coil and secondary coil.

It can be advantageous in this case for the booster coil to be of modular construction.

The above object also is achieved in accordance with the invention in a method for constructing the gradient system of a magnetic resonance tomography machine including the following steps:

i) calculating conductor tracks for the gradient coil for a prescribed homogeneity volume by using an optimization method, the design prescription of the primary coil and the secondary coil thereby being obtained, and ii) determining a subset of conductor tracks of the primary coil by means of which another prescribed homogeneity volume is produced together with the secondary coil and at least one booster coil likewise calculated by the above optimization method.

It can be advantageous in this case as well for the booster coil to be of modular construction.

According to the invention, an interconnection of the secondary coil with conductor bundles of the booster coil and with conductor bundles of the primary coil can be calculated so that different homogeneity volumes can be produced.

In the above method, the winding plane of the booster coil is arranged between the winding plane of the secondary coil and the winding plane of the primary coil.

DESCRIPTION OF THE DRAWINGS

FIG. 6a schematically illustrates the field pattern of two whole-body gradient fields with different homogeneity radii due to independent coil sections.

FIG. 6b is a transverse section (x-y plane) through a cylindrical whole-body tomograph with independent coil sections.

DESCRIPTION OF THE PREFERRED EMBODIMENTS

Figure 1:
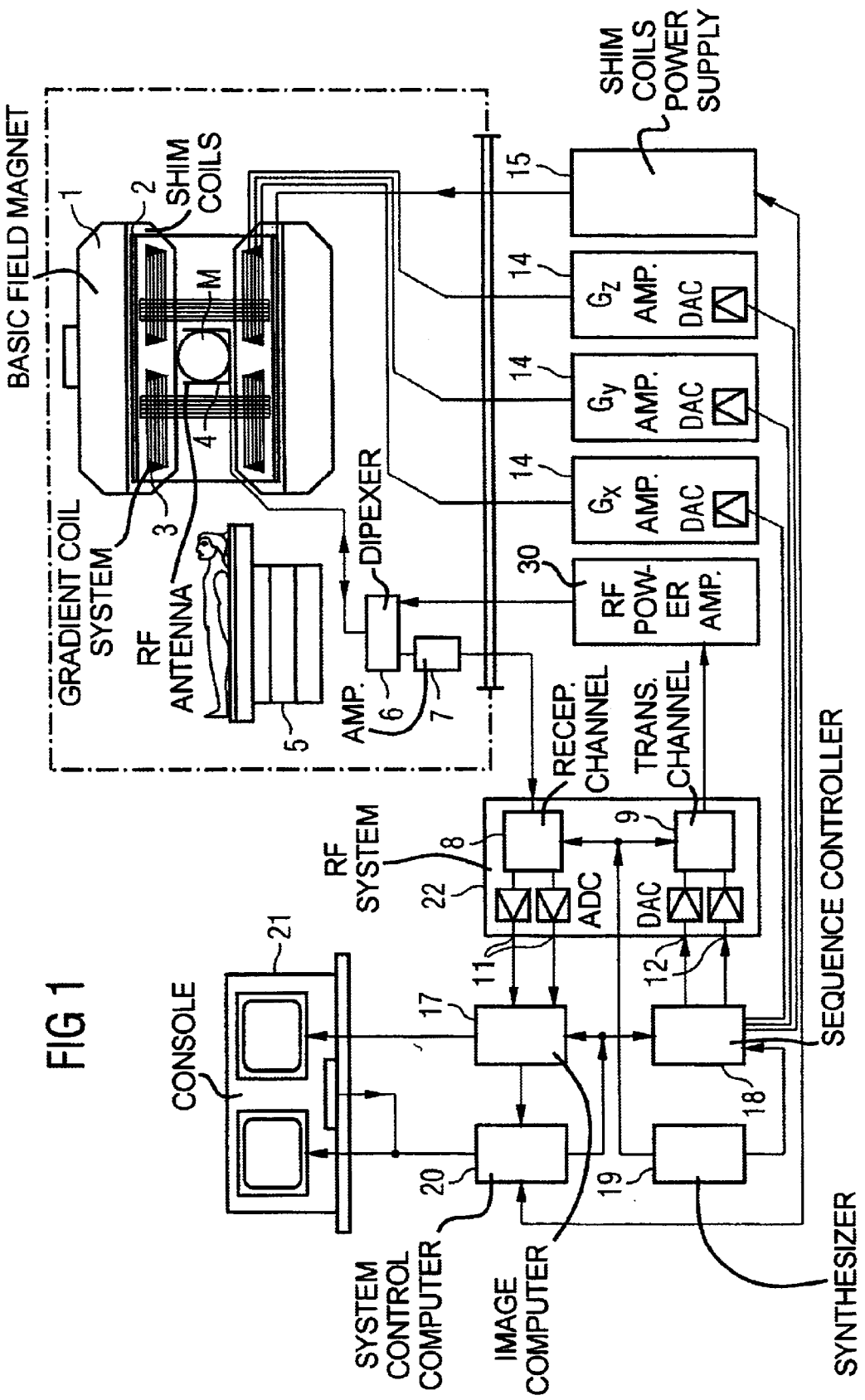
FIG. 1 schematically illustrates a magnetic resonance tomography apparatus with a gradient system according to the invention.

FIG. 1 is a schematic block diagram of a magnetic resonance tomography apparatus for producing a magnetic resonance image of an object in accordance with the present invention. The design of the magnetic resonance tomography apparatus corresponds to the design of a conventional tomography machine, with the differences discussed below. A basic field magnet 1 generates a temporarily constant strong magnetic field for polarizing and/or aligning the nuclear spins in the examination region of an object, such as, for example, a part to be examined in a human body. The high homogeneity, required for the spin resonance measurement, of the basic magnetic field is defined in a spherical measuring volume M—also termed homogeneity volume—into which the parts of the human body to be examined are introduced. So-called shim plates made from ferromagnetic material are fitted at suitable locations in order to support the homogeneity requirements and, in particular, to eliminate temporarily invariable influences. Temporarily variable influences are eliminated by shim coils 2 that are driven by a shim power supply unit 15.

Inserted into the basic field magnet 1 is a cylindrical switchable gradient coil system 3 that has three windings, each winding being of modular or bundled design and having a booster coil in accordance with the invention. Each part winding is supplied by an amplifier 14 with current for the purpose of generating a linear gradient field in the respective direction of the Cartesian coordinate system. The first winding of the gradient field system 3 in this case generates a gradient $G_x$ in the x-direction, the second winding generates a gradient $G_y$ in the y-direction, and the third winding generates a gradient $G_z$ in the z-direction. Each amplifier 14 has a digital-to-analog converter that is driven by a sequence controller 18 for correctly timed production of gradient pulses.

Located inside the gradient field system 3 is a radio-frequency antenna 4 that converts the radio-frequency pulses output by a radio-frequency power amplifier 30 into an alternating magnetic field for the purpose of exciting the nuclei and aligning the nuclear spins of the object to be examined or of the region of the object that is to be examined. The alternating field emanating from the precessing nuclear spins, that is to say, the nuclear spin echo signals caused by a pulse sequence of one or more radio-frequency pulses and one or more gradient pulses, is also converted by the radio-frequency antenna 4 into a voltage that is fed via an amplifier 7 to a radio-frequency receiving channel 8 of a radio-frequency system 22. The radio frequency system 22 also has a transmission channel 9, in which the radio-frequency pulses for exciting the nuclear spins are generated. In this case, the respective radio frequency pulses are represented digitally as a sequence of complex numbers in the sequence controller 18 dependent on a pulse sequence prescribed by the installation computer 20. This number sequence is fed as a real part and as an imaginary part via respective inputs 12 to a digital-to-analog converter in the radio-frequency system 22 and from there to a transmission channel 9. The pulse sequences are modulated in the transmission channel 9 on a radio-frequency carrier signal whose base frequency corresponds to the resonance frequency of the nuclear spins in the measuring volume.

The switchover from transmitting to receiving operation is performed via a duplexer filter 6. The radio frequency antenna 4 irradiates the radio frequency pulses for exciting the nuclear spins in the measuring volume M and samples the resulting echo signals. The received magnetic resonance signals are demodulated in a phase-sensitive fashion in the receiving channel 8 of the radio frequency system 22, and are converted into the real part and the imaginary part of the measurement signal via respective analog-to-digital converters. An image is reconstructed by an image computer 17 from the measured data obtained in such a way. The management of the measured data, the image data and the control programs is performed by a system computer 20. By prescription with control programs, the sequence controller 18 controls the generation of the desired pulse sequences and the corresponding sampling of k-space. In particular, the sequence controller 18 initially controls the correct time switching of the gradients, the emission of the radio frequency pulses with defined phase and amplitude, and the reception of the magnetic resonance signals. The time base for the radio frequency system 22 and the sequence controller 18 is made available by a synthesizer 19. The selection of corresponding control programs for generating a magnetic resonance image and the displaying of the generated magnetic resonance image are performed via a console 21 that has a keyboard and one or more display screens.

Generally, the gradient system 3 described in FIG. 1 generates a permanently defined field characteristic that is optimized either to a few applications, or constitutes a compromise between various requirements.

Depending on the application, in order to be able to find a compromise with reference to switching speed and image quality, and specifically with the boundary condition that peripheral nerve stimulation is to be avoided, a DSV-flexible MRT apparatus is desirable, and can be implemented according to the current state of the art by means of a discretely switchable gradient system in accordance with the strategies A) and B) described above.

The inventive method and apparatus are optimized with reference to the aforementioned disadvantages of A) and B), for calculating and constructing such a switchable gradient system.

Figure 2:
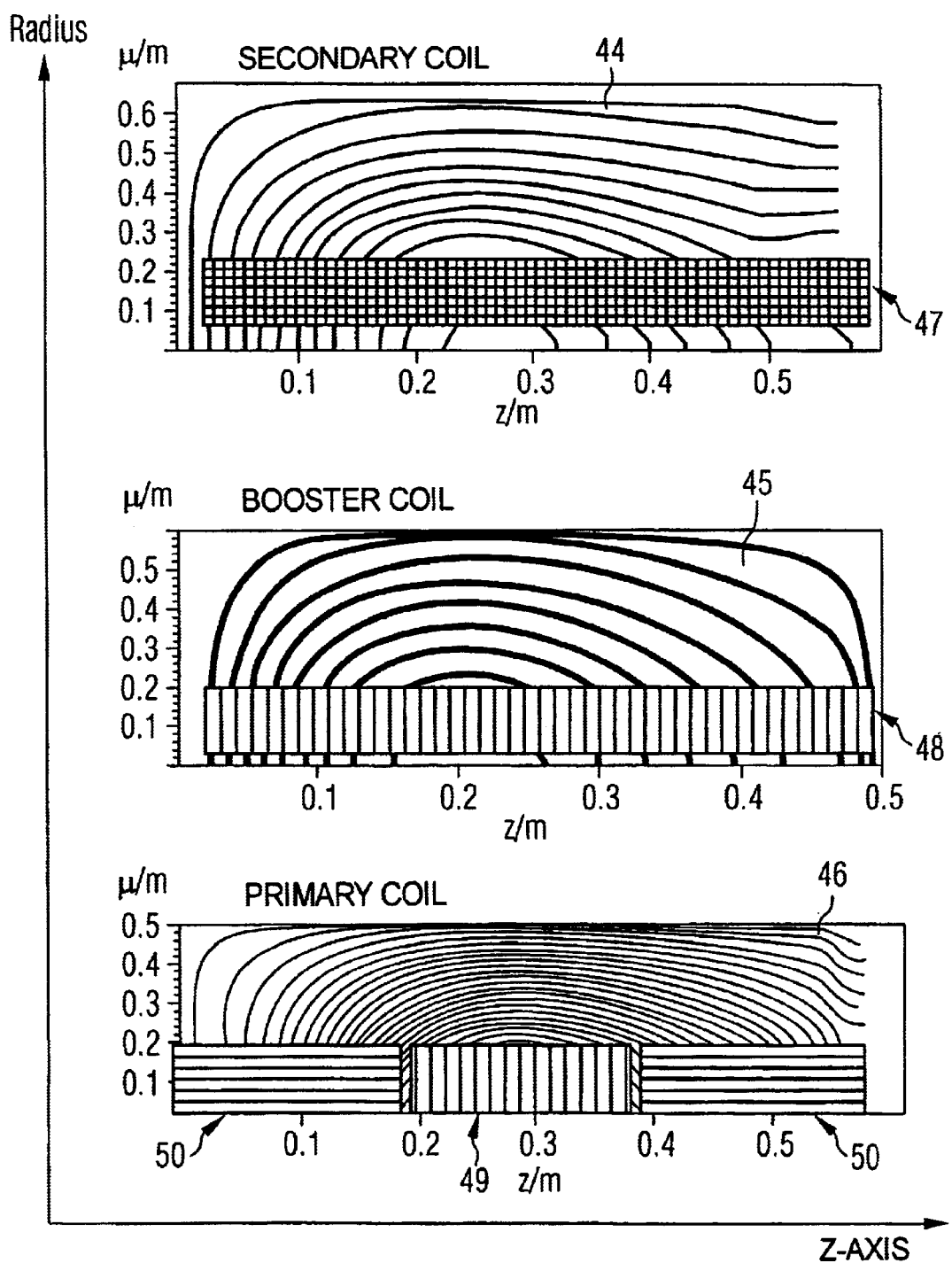
FIG. 2 shows the cylindrical coil of a gradient system according to the invention.

FIG. 2 shows a sketch of the principle of a switchable gradient coil for two field characteristics. FIG. 2 illustrates a part of the field-generating conductors in the form of three conductor track octants 44, 45, 46, and their corresponding longitudinal sections (conductor bundles) 47, 48, 49, 50 through the respective coil octant. The innermost tracks 46, which form the primary coil, is actively shielded—in accordance with method A)—by the outermost coil tracks 44, which form the secondary coil. This means that the two coils are tuned to one another such that specific properties (for example approximate freedom from rotational fields, etc.) are ensured in the homogeneity volume. The two coils are located on different winding planes, that is to say the two have respectively different radial spacings from the z-axis.

The primary coil is bundled in a modular fashion in accordance with method B), in order to be able to obtain two different field characteristics. Here, in the example of the transverse coil, the larger homogeneity volume is produced by superposition of all the primary coil bundles 49/50 (vertical hatching and horizontal hatching) and the secondary coil bundle 47 (vertically and horizontally hatched) without a booster coil. The second, smaller homogeneity volume (homogeneity ellipsoid) is produced by superposition of the primary coil bundle 50 (horizontally hatched) with the secondary coil bundle 47 and the so-called booster coil bundle 48. As described above, the reduction in the imaging volume is accompanied by a reduction in the field efficiency that, however, is compensated by employing a booster coil formed by tracks 45, located on an additional winding plane. The winding plane of the booster coil track 45 is arranged between the winding planes of the primary and secondary coils at the same level.

The booster coil is a simply structured additional coil that depends on the primary coil and the secondary coil in the sense that it permits a simplified conductor bundling in combination with these coils, that is to say it reduces the complexity of the bundling, and increases the field efficiency of small homogeneity volumes. Because it serves only as field-supplementing coil and need not generate a field independently, it has comparatively few turns and need not be shielded.

An example id described below as to how a coil combination according to FIG. 2 is calculated:

In a first step, the iterative target field method described above is used to calculate the conductor track design of the primary coil tracks 46, actively shielded by the secondary coil tracks 44, for the field mode with the larger homogeneity volume (large DSV).

In a second step, a subset of conductor tracks 46 of the primary coil is determined that produces the field mode with the small homogeneity volume (small DSV) together with the secondary coil tracks 44 and the additional coil (booster coil) tracks 45.

The corresponding conductor bundle of the small DSV can be selected optimally from the points of view of production engineering, for example in the form of a turn packet of directly neighboring conductors of the primary coil.

The magnetic flux density B(r, θ, φ) of the gradient field of a gradient coil arrangement is described by a spherical function expansion in accordance with the following equation:

$$B(r, \Theta, \varphi) = \sum_{l=0}^{\infty} \sum_{m=-l}^{+l} A_{(l,m)} \cdot r^l \cdot Y_{(l,m)}(\Theta, \varphi)$$

$A_{(l,m)}$ are the spherical coefficients in a suitable normalization. The position of a point in three-dimensional space is described starting from an origin by the spherical coordinates r, θ, and φ. The origin is generally located by definition at the center of the gradient system. $Y_{(l,m)}(\theta, \phi)$ are surface spherical harmonics that can be expanded by Legendre polynomials as a function of trigonometric functions.

In order, now, to calculate the magnetic flux density $B_{Booster}$ that the booster coil tracks 45 are intended to generate, the vector magnetic field sum of the conductor bundle 50 of the primary coil 46 $B_{Bundle}$ and that of the secondary coil 44 $B_{Shield}$ must be subtracted from the desired magnetic target field $B_{Soll}$ or the spherical surface coefficients $A_{Ref}$ thereof, which are, finally, to generate the magnetic flux density in the smaller DSV:

$$B_{Booster}(r, \theta, \varphi) = \sum_{l=0}^{\infty} \sum_{m=-l}^{+l} [A_{Ref}(l, m) - A_{Bundle}(l, m) - A_{Shield}(l, m)] \cdot r^l \cdot Y_{(l,m)}(\theta, \varphi)$$

The conductor tracks of the booster coil 45 are then calculated once again using the target field optimization method owing to the determined magnetic field $B_{Booster}$.

In accordance with experience, with cylindrical whole-body systems the booster coil bundle 45 resulting therefrom can be implemented with one third of the conductor tracks required for the primary coil bundle 46.

Figure 3:
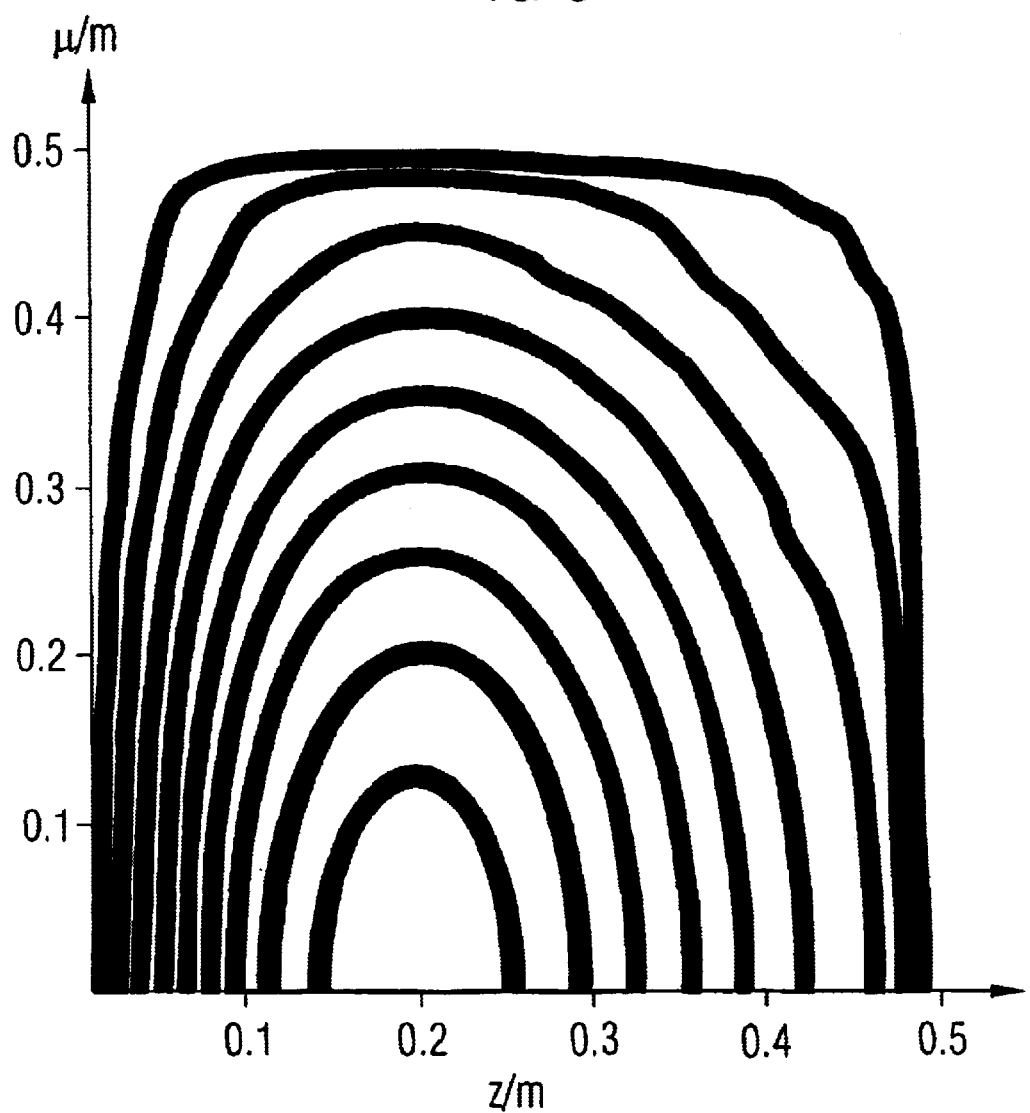
FIG. 3 shows the booster coil of the gradient system according to the invention.
Figure 4:
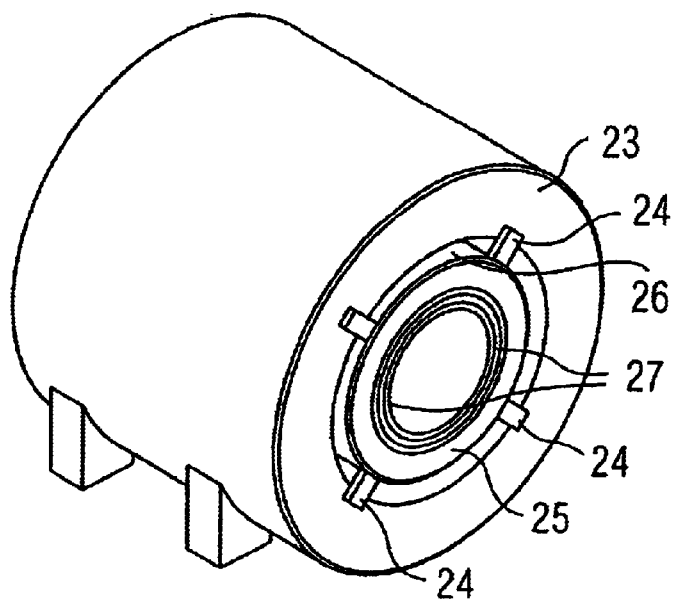
FIG. 4 is a perspective illustration of the basic field magnet with the gradient system according to the system.
Figure 5:
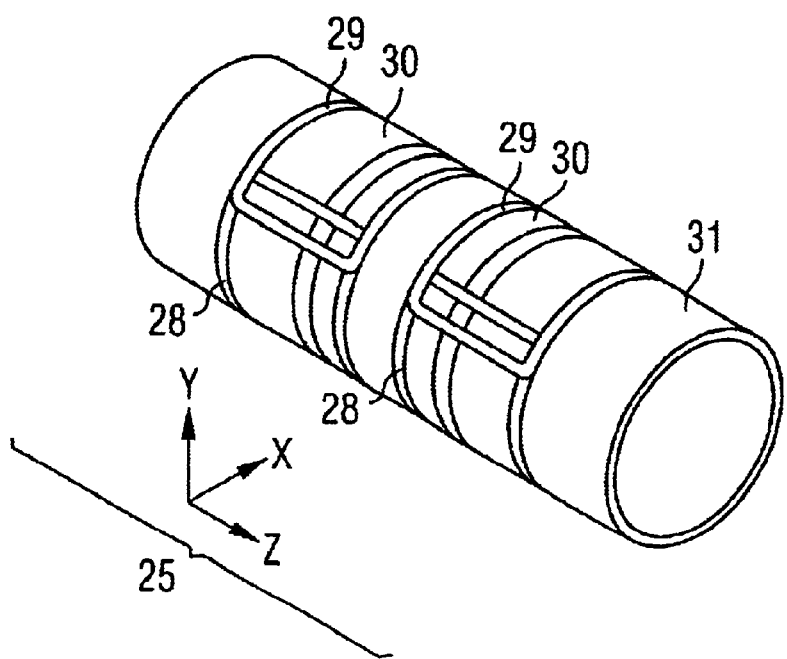
FIG. 5 is a perspective illustration of the gradient coil according to the invention with the three part windings.
Figure 7B:
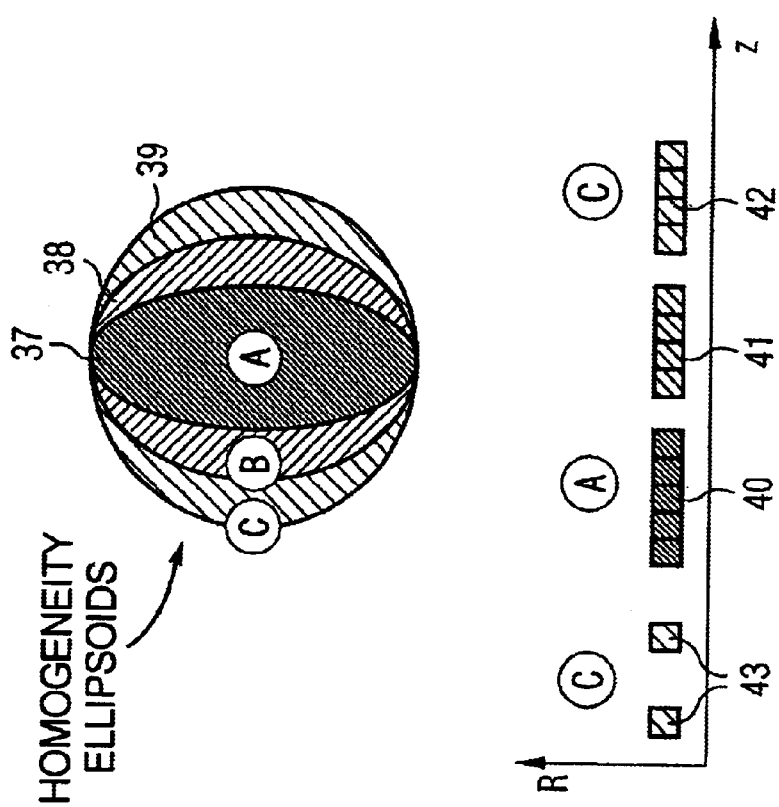
FIG. 7b illustrates the principle of the conductor bundling for longitudinal gradient coils (Maxwell coils).
Figure 7A:
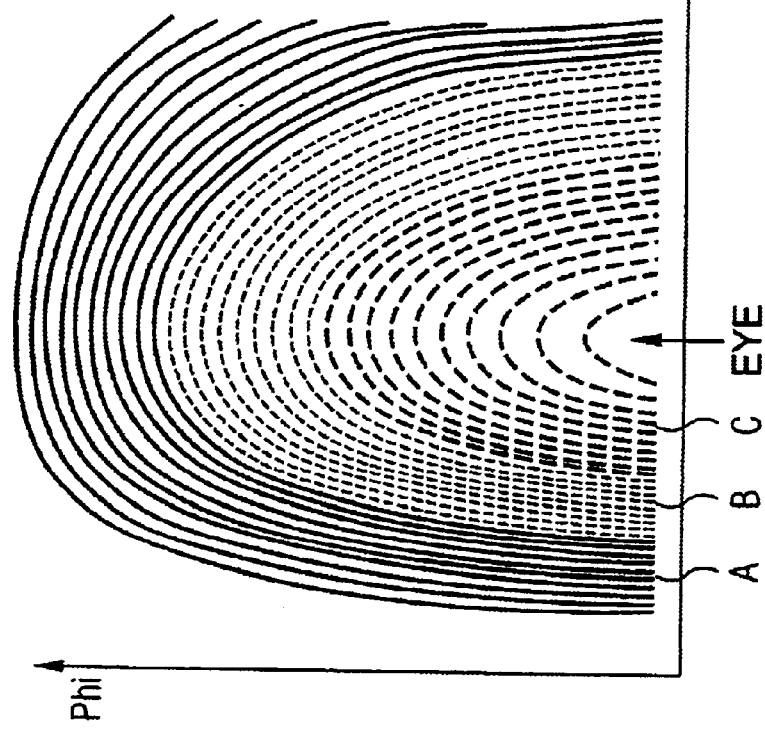
FIG. 7a illustrates the principle of the conductor bundling for transverse gradient coils (saddle coils).

As an example, FIG. 3 shows a booster coil for a primary coil with N=27 turns. The booster coil illustrated itself requires only N=9 turns in order to implement the appropriate field correction (field efficiency, reduction in complexity etc.) in the interior of the DSV. Because the booster coil serves only as field supplementing coil and need not generate a field independently, it has comparatively few turns and need not be shielded. For this reason, the space required for a booster coil is always present between primary and secondary coils of a conventional, actively shielded gradient system.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance tomography apparatus, the improvement of a gradient coil system, having a center, comprising:

at least one gradient coil arrangement for generating a gradient field in a spatial direction, said gradient coil arrangement comprising a primary coil having a plurality of different conductor bundles and a secondary coil for shielding said primary coil, said primary coil and said secondary coil interacting to produce a gradient field, and said primary coil and said secondary coil being selectively connectable to produce said gradient field in a plurality of different homogeneity volumes at said center, and at least one booster coil interconnected with said conductor bundles and with said secondary coil to supplement the gradient field in the different homogeneity volumes.

2. A magnetic resonance tomography apparatus as claimed in claim 1 wherein at least one of said conductor bundles of said primary coil is connected in series with said secondary coil and with said at least one booster coil to produce a selected homogeneity volume.

3. A magnetic resonance tomography apparatus as claimed in claim 1 wherein said at least one booster coil is disposed in a winding plane between said primary coil and said secondary coil.

4. A magnetic resonance tomography apparatus as claimed in claim 1 wherein said booster coil has a modular conductor structure.

* * * * *